(12) United States Patent
Fetzer et al.

(10) Patent No.: US 12,249,666 B2
(45) Date of Patent: Mar. 11, 2025

(54) USE OF A LOW BANDGAP ABSORBER REGION IN A LASER POWER CONVERTER

(71) Applicant: The Boeing Company, Chicago, IL (US)

(72) Inventors: Christopher M. Fetzer, Saugus, CA (US); Dimitri D. Krut, Encino, CA (US)

(73) Assignee: The Boeing Company, Arlington, VA (US)

( * ) Notice: Subject to any disclaimer, the term of this patent is extended or adjusted under 35 U.S.C. 154(b) by 247 days.

(21) Appl. No.: 16/216,449

(22) Filed: Dec. 11, 2018

(65) Prior Publication Data

US 2020/0185559 A1   Jun. 11, 2020

(51) Int. Cl.
*H01L 31/0687* (2012.01)
*H01L 31/0352* (2006.01)
*H01L 31/0725* (2012.01)

(52) U.S. Cl.
CPC .......... *H01L 31/06875* (2013.01); *H01L 31/035272* (2013.01); *H01L 31/0725* (2013.01)

(58) Field of Classification Search
CPC .......... H01L 31/0304; H01L 31/03046; H01L 31/035236; H01L 31/06875; H01L 31/0693; H01L 31/0735; H01L 31/09; H01L 31/16
See application file for complete search history.

(56) References Cited

U.S. PATENT DOCUMENTS

| | | | |
|---|---|---|---|
| 9,530,911 B2 | 12/2016 | King et al. | |
| 2006/0048811 A1 | 3/2006 | Krut et al. | |
| 2007/0137695 A1* | 6/2007 | Fetzer | H01L 31/075 136/255 |
| 2012/0240987 A1* | 9/2012 | King | B82Y 20/00 136/255 |
| 2017/0092800 A1* | 3/2017 | Derkacs | H01L 31/078 |

OTHER PUBLICATIONS

C. Vadivia. "Five-Volt vertically-stacked, single cell GaAS photon power converter", Proc. SPIE 9358E (Mar. 16, 2015), 9 pages.

* cited by examiner

*Primary Examiner* — Lindsey A Buck
(74) *Attorney, Agent, or Firm* — Harrity & Harrity, LLP

(57) ABSTRACT

A low bandgap absorber region (LBAR) used in a laser power converter (LPC). The laser power converter is comprised of one or more subcells on a substrate, wherein at least one of the subcells has an emitter and base, with the low bandgap absorber region coupled between the emitter and base. The emitter and base are comprised of a material with a bandgap higher than a wavelength of incident laser light, and the low bandgap absorber region is comprised of a material with a bandgap lower than the emitter and base. The emitter and base are transparent to the incident laser light, and the low bandgap absorber region absorbs the incident laser light and generates a current in response thereto, such that the current is controlled by the material and thickness of the low bandgap absorber region. The low bandgap absorber region is configured to produce a current balanced to the subcells connected in series.

23 Claims, 5 Drawing Sheets

USE OF A LOW BANDGAP ABSORBER REGION IN A LASER POWER CONVERTER

CROSS REFERENCE TO RELATED APPLICATIONS

This application is related to the following co-pending and commonly-assigned applications:

U.S. Utility application Ser. No. 16/057,419, filed on Aug. 7, 2018, by Christopher Fetzer, Dmitri Krut, David Joslin, and Richard King, entitled "REDUCED BAND GAP ABSORBER FOR SOLAR CELLS," which application is a continuation under 35 U.S.C. Section 120 of co-pending and commonly-assigned U.S. Utility application Ser. No. 11/305,967, filed on Dec. 19, 2005, by Christopher Fetzer, Dmitri Knit, David Joslin, and Richard King, entitled "REDUCED BAND GAP ABSORBER FOR SOLAR CELLS," now U.S. Pat. No. 10,069,026, issued Sep. 4, 2018;

U.S. Utility application Ser. No. 15/353,557, filed on Nov. 16, 2016, by Richard R. King, Christopher M. Fetzer, Daniel C. Law, Xing-Quan Liu, William D. Hong, Kenneth M. Edmondson, Dmitri D. Krut, Joseph C. Boisvert, and Nasser H. Karam, and entitled "SOLAR CELL STRUCTURES FOR IMPROVED CURRENT GENERATION AND COLLECTION," which application is a continuation under 35 U.S.C. Section 120 of co-pending and commonly-assigned U.S. Utility application Ser. No. 13/831,056, filed on Dec. 7, 2016, by Richard R. King, Christopher M. Fetzer, Daniel C. Law, Xing-Quan Liu, William D. Hong, Kenneth M. Edmondson, Dmitri D. Knit, Joseph C. Boisvert, and Nasser H. Karam, and entitled "SOLAR CELL STRUCTURES FOR IMPROVED CURRENT GENERATION AND COLLECTION," now U.S. Pat. No. 9,530,911, issued Dec. 27, 2016; and U.S. Utility application Ser. No. 13/069,274, filed on Mar. 22, 2011, by Richard King, Christopher M. Fetzer, Dmitri D. Krut, and Nasser H. Karam, and entitled "METAMORPHIC SOLAR CELL HAVING IMPROVED CURRENT GENERATION,";

all of which applications are incorporated by reference herein.

BACKGROUND

1. Field

The disclosure is related generally to a laser power converter (LPC), and more specifically, to the use of a low bandgap absorber region (LBAR) in an LPC.

2. Background

LPCs are similar to solar cells, except that they convert a monochromatic beam of coherent radiation at a specific wavelength from a laser into a voltage and current. Like solar cells, LPCs become more efficient with multiple p-n junctions. However, as the incident laser light is monochromatic, the junctions are the same bandgap material.

For example, an 808 nm laser used to beam power can be captured by a GaAs two-junction (2J) LPC comprised of a bottom subcell and a top subcell. The top subcell is typically thinner than the bottom subcell to evenly distribute the photocurrent between both subcells. These devices are able to reach about 60% wall plug efficiency.

As a power beaming solution, GaAs 2J LPCs typically operate at about 2 volts (2V) for such a system, with each subcell generating 1V. Typically, these GaAs 2J LPCs are then processed together to make three LPCs in series to generate 6V or more.

What is needed, then, are improved LPCs.

SUMMARY

To overcome the limitations described above, and to overcome other limitations that will become apparent upon reading and understanding the present specification, the present disclosure describes an LBAR used in an LPC, and a method of fabricating an LPC with an LBAR.

The LPC is comprised of one or more subcells fabricated on a substrate, wherein at least one of the subcells has an emitter and base, with a LBAR coupled between the emitter and base. The emitter and base are comprised of a material with a bandgap higher than a wavelength of incident laser light, and the LBAR is comprised of a material with a bandgap lower than the emitter and base. The emitter and base are transparent to the incident laser light, and the LBAR absorbs the incident laser light and generates a current in response thereto, such that the current is controlled by the material and thickness of the LBAR.

The LPC may have two or more of the subcells, each with a different bandgap, wherein the LBAR is configured to produce a current balanced to the subcells connected in series.

The subcells may be lattice matched to the substrate, or the subcells may have a lattice constant different than the substrate and the subcells are metamorphically grown on the substrate.

The LBAR may be present in a top or middle subcell of the LPC, or the LBAR may be present in all of the subcells of the LPC. The incident laser light not absorbed by the LBAR passes through to another one of the subcells.

In one example, the material of the LBAR comprises GaAs and the material of the base and emitter comprises AlGaAs; in another example, the material of the LBAR comprises GaInAs and the material of the base and emitter comprises AlGaAs; in yet another example, the material of the LBAR comprises GaInAs and the material of the base and emitter comprises GaAs.

The LBAR may be comprised of one or more well layers contained within a region of barrier layers.

DRAWINGS

Referring now to the drawings in which like reference numbers represent corresponding parts throughout:

DETAILED DESCRIPTION

Figure 1:
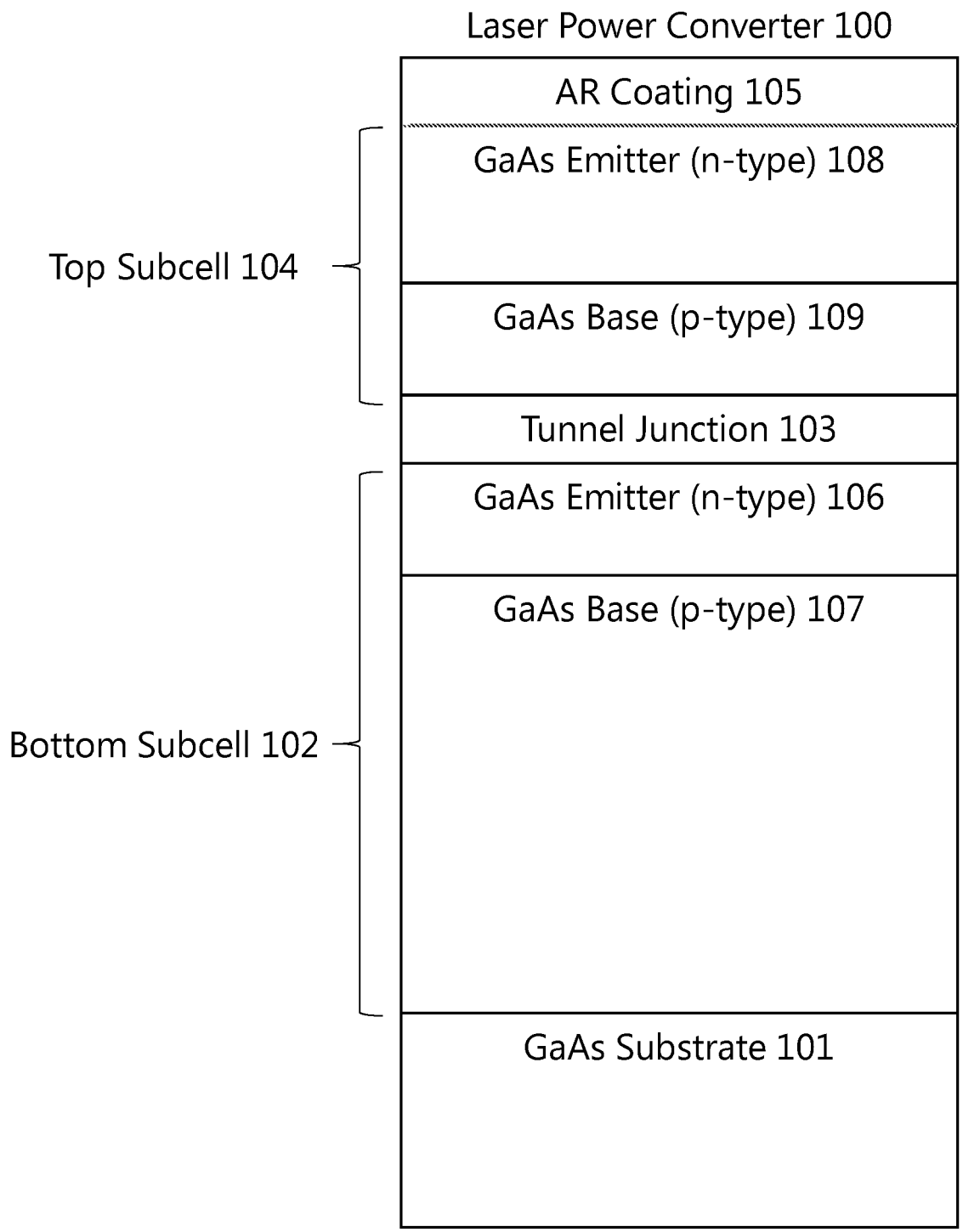
FIG. 1 is an example schematic showing a cross-section of an LPC in one configuration.

In the following description, reference is made to the accompanying drawings which form a part hereof, and in which is shown by way of illustration a specific example in which the disclosure may be practiced. It is to be understood that other examples may be utilized and structural changes may be made without departing from the scope of the present disclosure.

Overview

A new approach to the design of laser power converters (LPCs) includes an LBAR in an LPC. Specifically, this disclosure is a device structure that enables a high-voltage or multiple-junction LPC. The LBAR, which can be comprised of one or more well layers and barrier layers, is used to separate the functions of absorption and collection of free carriers in at least one subcell of an LPC. The LBAR can also be used in thermophotovoltaic (TPV) devices in a similar fashion.

Throughout this specification, the terms "top subcell," "bottom subcell," and "middle subcell," are used. In the examples set forth herein, these terms refer to the subcells' order of formation, as well as their orientation to the incident light. However, in other examples, these terms do not refer to the subcells' order of formation, as the subcells can be formed in an inverted order, and these terms refer only to their orientation to the incident light.

In a multi junction LPC, there currently is a limitation of about 2J in practical applications. This occurs because the top subcell to produce a 3J device would be too thin to work in a practical manner. In the case of an LPC absorbing laser light at a wavelength of about 808 nm, the emitter and base of a GaAs top subcell of a hypothetical 3J LPC device would need to be on the order of a 200 to 300 Angstroms (A) thick. However, this thickness does not provide enough lateral conduction to draw current from the junction into a front contact grid. Previous efforts have attempted such devices with only limited success.

By using an LBAR between the emitter and base in one or more of the subcells, the functions of the absorption and collection of the subcell components are decoupled. In the example described above, using a GaAs 2J LPC with 808 nm laser light, the top subcell would use a material such as AlGaAs or AlGaInAs with a bandgap higher than the wavelength of the incident laser light.

Specifically, the energy of the incident light is higher than the bandgap energy. As an example, 808 nm laser light is a common power conversion wavelength. As a result, the bandgap of the surrounding AlGa(In)As alloy would be higher than 1.528 eV at the device operating temperature. Thus, to provide some margin and avoid absorption in the cladding emitter and base, the light should be 1 kT in energy (~25 meV higher) and the bandgap of the AlGa(In)As alloy should be greater than about 1.55 eV. For AlGaAs, this means the Al content should be higher than a mole fraction of about 10% in the alloy.

The LBAR inserted between the emitter and base of the subcell would then absorb the incident laser light, leaving non-absorbed laser light to pass through to the bottom subcell. Therefore, the balance of current collection between the top and bottom subcell is controlled with the material and thickness of the LBAR only, and the emitter and base can be fabricated using any more optimal or convenient thickness.

This concept can be used to realize a higher efficiency 3J LPC. While 2J LPCs may approach about 60% efficiency, a 3J LPC would be capable of greater than about 60% conversion efficiency.

An additional benefit is that the top subcell then may be measured with more standard quantum efficiency measurement techniques used for multi junction (MJ) solar cells. As the top subcell's emitter and base are of a different bandgap than the bottom subcell, they can be selectively biased out of the measurement to probe the top or bottom subcell, which is something present 2J devices cannot easily do.

In this context, a different bandgap means higher in energy. In spectral response measurements, one can distinguish the different contributions of two junctions by flooding the junction with light (light biasing) that the other junction cannot absorb. This is a common method for measuring multi junction solar cells. In standard 2J LPCs, or LPCs with more than 2 junctions, light biasing does not work, because the junctions have the same bandgap and respond to the same light, and thus one junction cannot be biased out of the measurement. This is a limitation that makes the device more difficult to fabricate.

Alternatively, the LBAR may enable extending the wavelength of the GaAs structure to a longer wavelength laser light beam, but still remain lattice matched. Specifically, this reduces the bandgap of the LBAR relative to the substrate. Another alternative is to grow a metamorphic layer.

The bulk of the device would comprise GaAs, but the LBAR (in a type of strain-balanced well/barrier structure) may then extend the absorption to a wavelength longer than an absorption edge cut-off wavelength of the base material. This design could be used to enable much longer wavelength LPCs without resorting to metamorphic growth techniques. However, one may conceive that the design also may be employed with metamorphic growth techniques.

Furthermore, such a design can be useable in a TPV, where a large number of devices are processed into a series connection similarly to the LPC devices. This would extend the TPV to using higher bandgap materials for voltage production, while absorption is controlled by the LBAR in each device. Thus, a 2J or 3J TPV device may be more easily fabricated and improve the overall TPV device efficiency.

The end result is an improved LPC, which can be used, for example, for power transmission without electrical interference. Power beaming in commercial aircraft would become more attractive as the LPC's efficiency increases, replacing wiring weight for fiber optic power transmission and/or free-space power beaming to drones. Other examples include aerospace power beaming of LPC conversion for long-distance power to lunar or similar deep space missions, which are greatly enabled by the increased efficiency of the LPC.

Device Structures

FIG. 1 is an example schematic showing a cross-section of a device comprising an n-on-p III/V LPC 100 in one configuration.

The LPC 100 includes a GaAs substrate 101, upon which is fabricated a bottom subcell 102, a tunnel junction 103, a top subcell 104 and an anti-reflective (AR) coating 105. The bottom subcell 102 is comprised of a GaAs emitter (n-type) 106 and a GaAs base (p-type) 107. The top subcell 104 is comprised of a GaAs emitter (n-type) 108 and a GaAs base (p-type) 109. (In the figures, other layers, such as contact, window and back surface field layers, are omitted for the purposes of clarity.) Each of the subcells 102, 104 comprises a p-n junction, thereby forming a multi junction LPC 100.

This multi junction LPC 100 is fabricated monolithically as a single stack of layers with an epitaxial relationship (homo-epitaxial or hetero-epitaxial) from one layer to the layer above, with the bottom subcell 102 and top subcell 104 comprising the same bandgap material, in this example, GaAs.

Since the laser light incident on the LPC 100 is monochromatic and the bottom and top subcells 102, 104 are series-connected, the voltages of the two subcells 102, 104 are additive. Typically, the LPC 100 operates at 2V (1V per junction) for 808 nm laser light.

Because the subcells 102, 104 are tandem or series-connected, the subcell 102, 104 producing the lowest current limits the LPC 100. Moreover, the top subcell 104 is very thin relative to the bottom subcell 102. In one example, the bottom subcell 102 is about 3-4 µm thick, while the top subcell 104 is about 0.5 µm thick.

One limitation with this LPC 100 is that, to make a higher voltage LPC, for example, generating 3V, a third junction or subcell of GaAs (not shown) needs to be placed on top of the top subcell 104 (with another tunnel junction between the third subcell and the top subcell 104, and the AR coating 105 deposited on the third subcell). However, a third subcell would need to be very thin, for example, about 0.1 µm or thinner, to balance the 3J LPC.

Another limitation with this LPC 100, is that most LPCs operate better at 6V, which means processing three 2V-generating LPCs 100 together in complex processing that increases cost.

Figure 2:
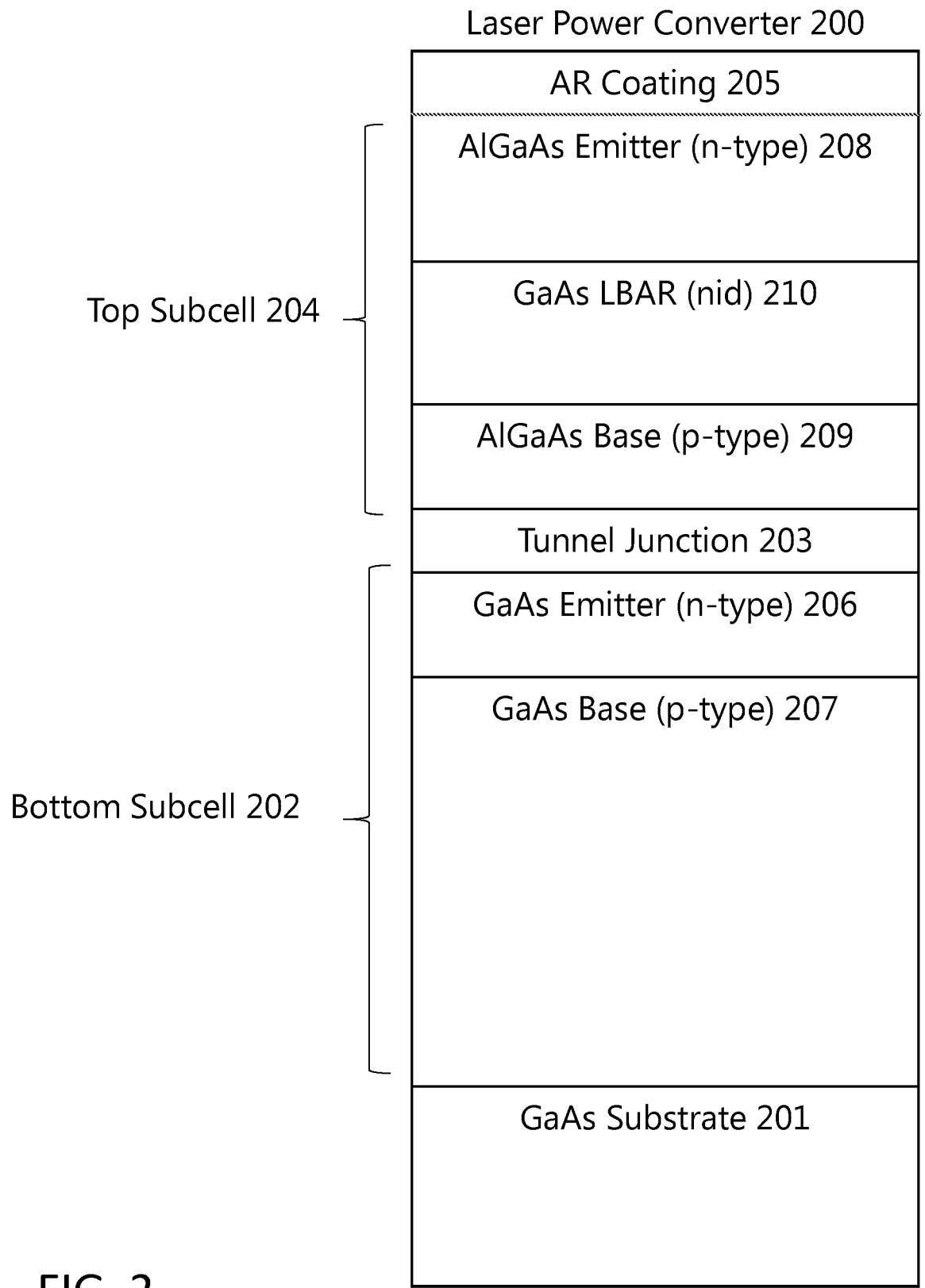
FIG. 2 is an example schematic showing a cross-section of an LPC in another configuration.

FIG. 2 is an example schematic showing a cross-section of a device comprising an n-on-p III/V LPC 200 in another configuration.

The LPC 200 includes a GaAs substrate 201, upon which is fabricated a bottom subcell 202, a tunnel junction 203, a top subcell 204 and an AR coating 205. The bottom subcell 202 is comprised of a GaAs emitter (n-type) 206 and a GaAs base (p-type) 207. The top subcell 204 is comprised of an AlGaAs emitter (n-type) 208 and an AlGaAs base (p-type) 209, and thus has a different bandgap than the bottom subcell 202. In addition, the top subcell 204 includes a GaAs LBAR 210 that is not intentionally doped (nid).

The GaAs LBAR (nid) 210 may comprise one or more well layers, whether quantum confined or not, or double heterostructures, contained within a region of barrier layers for generating a current, wherein the well layers or double heterostructures have a bandgap less than or equal to the barrier layers, for example, $E_{g,\ barrier} - E_{g,\ well} <= 0$ eV. The GaAs LBAR (nid) 210 is coupled between the AlGaAs emitter (n-type) 208 and the AlGaAs base (p-type) 209. the GaAs LBAR (nid) 210 has a lower bandgap than the AlGaAs emitter (n-type) 208 and the AlGaAs base (p-type) 209, for example, $E_{g,\ LBAR} - E_{g,\ emitter} < 0$ eV and $E_{g,\ LBAR} - E_{g,\ base} < 0$ eV. The AlGaAs emitter (n-type) 208 and the AlGaAs base (p-type) 209 are made from a higher bandgap material (AlGaAs in this example) than the GaAs LBAR (nid) 210 that is transparent to the incident laser light, for example, $E_{g,\ LBAR} - E_{g,\ emitter} < 0$ eV and $E_{g,\ LBAR} - E_{g,\ base} < 0$ eV. In this context, transparent means that light passes through the material with no or negligible absorption.

As a result, the GaAs LBAR (nid) 210 absorbs the incident laser light below a bandgap of the AlGaAs emitter (n-type) 208 and AlGaAs base (p-type) 209, and produces a current by generating electron-hole pairs as free carriers that are emitted and collected at the AlGaAs emitter (n-type) 208 and AlGaAs base (p-type) 209. Specifically, the incident laser light has an energy below the bandgap energy of the AlGaAs emitter 208 and base 209. The incident laser light not absorbed by the GaAs LBAR (nid) 210 passes through to the bottom subcell 202.

Because the GaAs LBAR (nid) 210 is the only part of the top subcell 204 absorbing the incident laser light, the material and thickness of the GaAs LBAR (nid) 210 is what controls the current balance between the bottom and top subcells 202, 204. Specifically, the GaAs LBAR (nid) 210 in the top subcell 204 is configured to produce a current balanced to the bottom subcell 202 connected in series. The effect or result of this configuration is that the functions of the emitter 208 and base 209 in the top subcell 204 are no longer thickness limited to balance the current generation between the bottom and top subcells 202, 204.

Thus, in this example, the LPC 200 has two subcells 202, 204, each with a different bandgap, wherein the LBAR (nid) 210 is configured to produce a current balanced to the subcells 202, 204 connected in series. In addition, the incident laser light not absorbed by the LBAR (nid) 210 passes through to another one of the subcells 202. Moreover, the material of the LBAR (nid) 210 comprises GaAs and the material of the base 209 and emitter 208 in the top subcell 204 comprises AlGaAs.

Figure 3:
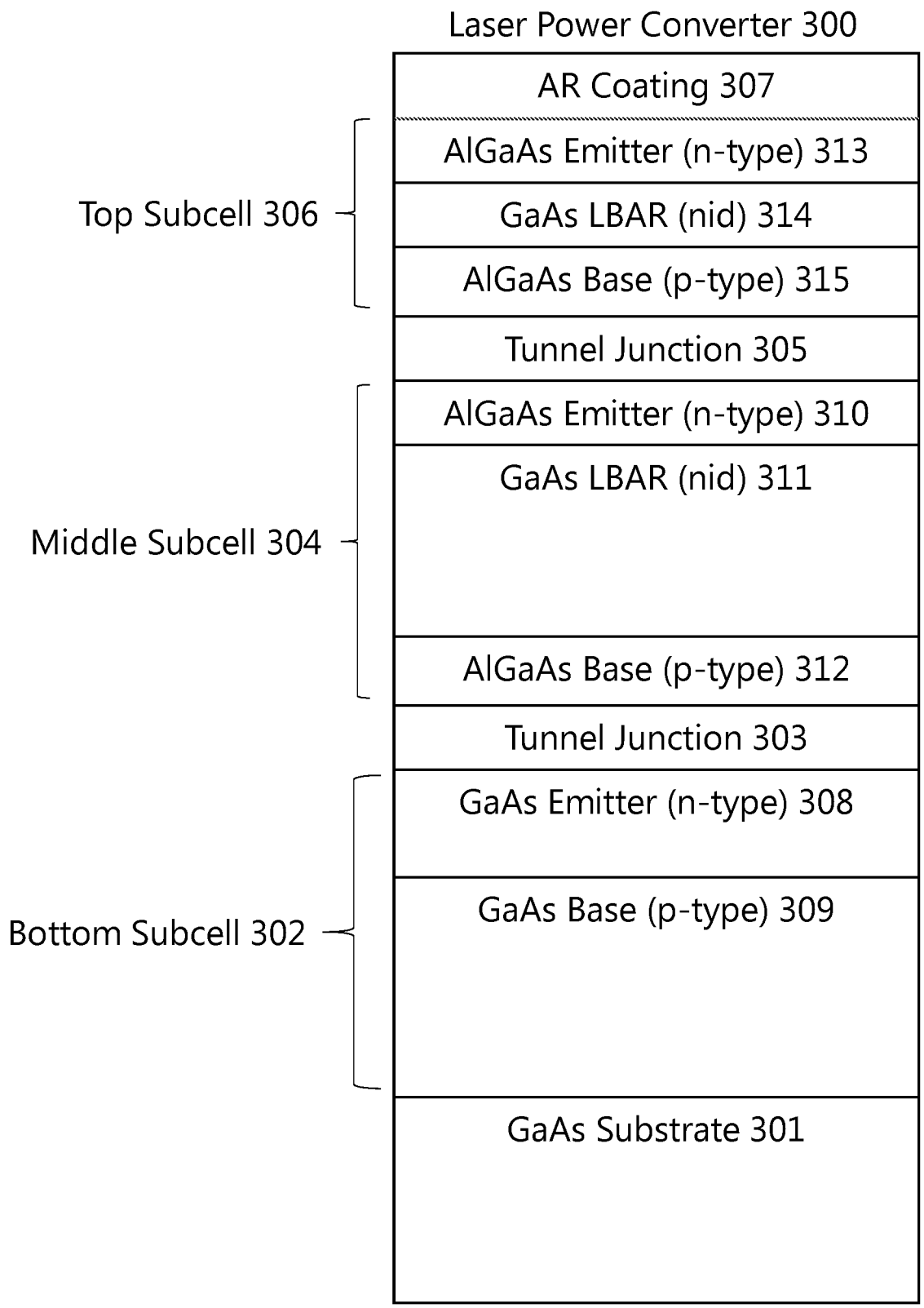
FIG. 3 is an example schematic showing a cross-section of an LPC in still another configuration.

FIG. 3 is an example schematic showing a cross-section of a device comprising an n-on-p III/V LPC 300 in still another configuration.

The LPC 300 includes a GaAs substrate 301, upon which is fabricated a bottom subcell 302, a tunnel junction 303, a middle subcell 304, a tunnel junction 305, a top subcell 306 and an AR coating 307. The substrate 301 typically stays in place, but there are examples where the substrate may be removed.

The bottom subcell 302 is comprised of a GaAs emitter (n-type) 308 and a GaAs base (p-type) 309. The middle subcell 304 is comprised of an AlGaAs emitter (n-type) 310, a GaAs LBAR (nid) 311 and a GaAs base (p-type) 312. The top subcell 306 is comprised of an AlGaAs emitter (n-type) 313, a GaAs LBAR (nid) 314 and an AlGaAs base (p-type) 315.

In this configuration, the middle and top subcells 304, 306 each contain LBARs 311, 314 of different thicknesses to balance the current between the three subcells 302, 304, 306. If the material of the LBARs 311, 314 is the same, then the LBARs need to have different thicknesses; alternatively, if the material of the LBARs 311, 314 is different, then the thicknesses of both LBARs may be the same.

For an example 2 LBAR configuration, and absorbing all the light (where the third junction is fully absorbing), and the device is exactly current balanced between all three junctions (maximum current case), the thickness of the top LBAR is=ln(1.5)/a and the thickness of the lower LBAR is=ln(2)/a, where a is the absorption coefficient of the LBAR material at the laser wavelength. The relative thickness of the LBARs (thickness top/thickness bottom) is then ln(1.5)/ln(2)=~0.585. So, the top LBAR thickness is approximately 58% of the lower LBAR thickness. This ratio is independent of laser light wavelength or LBAR material.

The emitters and bases 310, 312, 313, 315 in the middle and top subcells 304, 306 are no longer restricted in thickness because they do not absorb light; only the LBARs 311, 314 absorb light.

The LBARs 311, 314 in the middle and top subcells 304, 306 may not be the same thickness. Moreover, the LBARs 311, 314 in the middle and top subcells 304, 306 may not be the same material or have the same bandgap; instead, the combinations of thicknesses and bandgaps are chosen such that current generated in each subcell 302, 304, 306 is equal.

When all currents are equal, the overall device produces the maximum current and nearly the maximum voltage. Near this point, the maximum device conversion efficiency is produced. Typically, the combinations are chosen to produce the maximum conversion efficiency of the overall device.

The LPC 300 in this configuration will produce 3V with better control over subcell current balance and hence maximum achievable power efficiency in a series-connected set of diodes. In addition, the concept can be extended to a 6J or 6V (or more) LPC that would reduce processing complexity even more.

In general, the higher the LPC voltage, the better the system level efficiency of power transmission. A common device design is a 6V LPC device, where three 2V LPC devices are combined to produce 6V, two 3V LPC devices would be needed to produce 6V. There is a complexity, including cost and yield, in producing multiple devices. As a result, a 6J LPC device, monolithically fabricated, producing 6V is simpler and cheaper to produce than the combined 2V or 3V LPC devices of today.

Better control also implies manufacturing control (e.g., repeatability, uniformity) or the ability to design beyond current state of the art capabilities of epitaxial growth tools.

Thus, in this example, the LPC 300 has two or more (i.e., three) subcells 302, 304, 306, each with a different bandgap, wherein the LBAR (nid) 311 and the LBAR (nid) 314 are configured to produce a current balanced to the subcells 302, 304, 306 connected in series. In addition, the incident laser light not absorbed by the LBAR (nid) 314 and the LBAR (nid) 311 passes through to another one of the subcells 304 and/or 302. Moreover, the material of the LBAR (nid) 314 comprises GaAs and the material of the base 315 and emitter 313 in the top subcell 306 comprises AlGaAs; and the material of the LBAR (nid) 311 comprises GaAs and the material of the base 312 and emitter 310 in the middle subcell 304 comprises AlGaAs.

Figure 4:
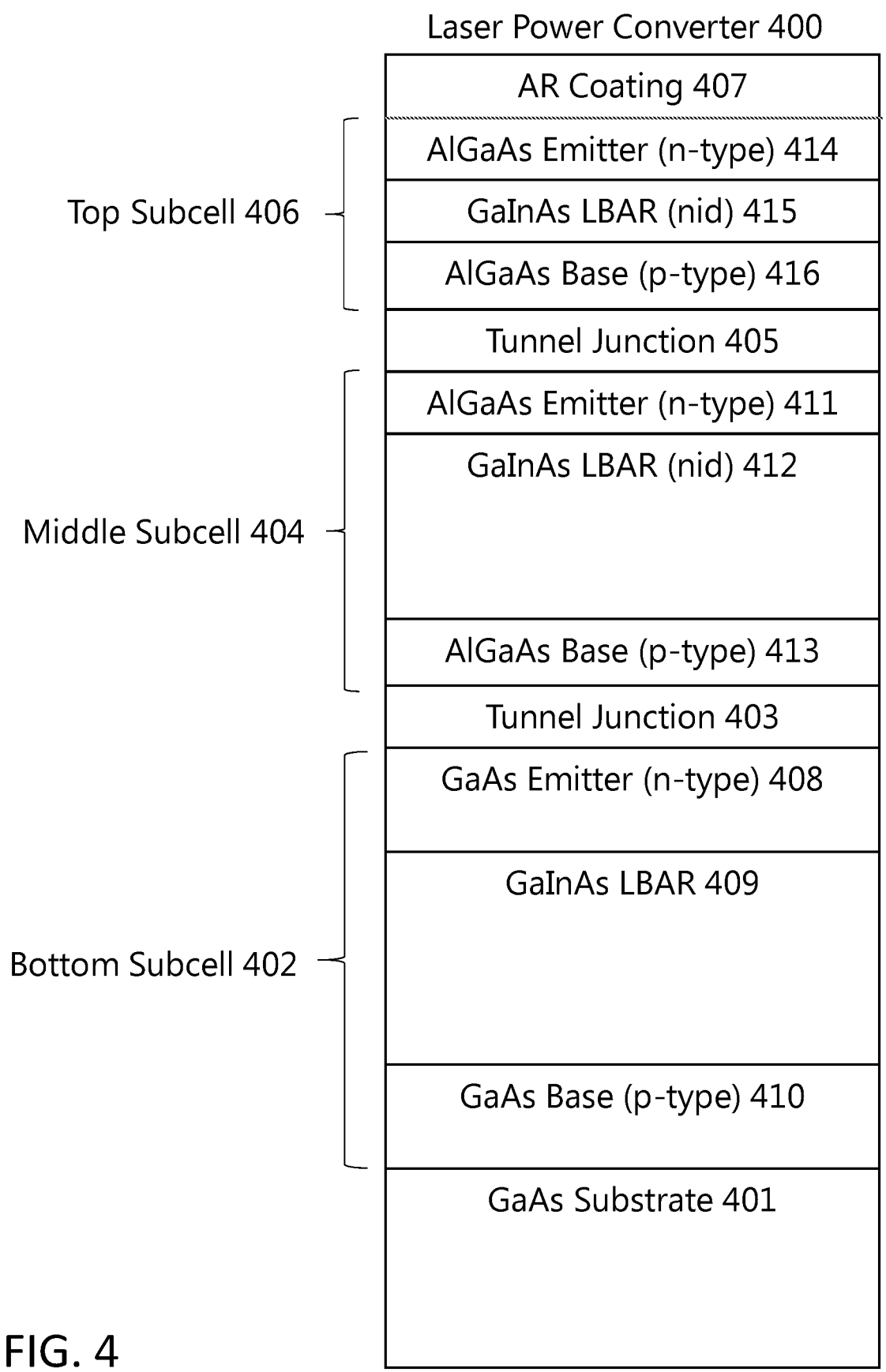
FIG. 4 is an example schematic showing a cross-section of an LPC in yet another configuration.

FIG. 4 is an example schematic showing a cross-section of a device comprising an n-on-p III/V LPC 400 in yet another configuration.

The LPC 400 includes a GaAs substrate 401, upon which is fabricated a bottom subcell 402, a tunnel junction 403, a middle subcell 404, a tunnel junction 405, a top subcell 406 and an AR coating 407, wherein each of the subcells 402, 404 and 406 absorb different wavelengths of the incident laser light. To accomplish this, the bottom subcell 402 is comprised of a GaAs emitter (n-type) 408, a GaInAs LBAR 409 and a GaAs base (p-type) 410; the middle subcell 404 is comprised of an AlGaAs emitter (n-type) 411, a GaInAs LBAR (nid) 412 and an AlGaAs base (p-type) 413; and the top subcell 406 is comprised of an AlGaAs emitter (n-type) 414, a GaInAs LBAR (nid) 415 and an AlGaAs base (p-type) 416. Thus, an LBAR 409, 412, 415 is present in all of the subcells 402, 404, 406 of the LPC 400.

When the LPC 400 is a 3J (or more than 3J) LPC 400, LBARs 409, 412, 415 can be included; these may be strained if thin enough to avoid lattice relaxation or be interspersed with strain balancing barriers. In this context, if the well layer is compressive relative to the substrate, the barriers would need to be tensile in strain to compensate the energy and allow a pseudomorphic combination to exist (known as a strain balanced superlattice). Thin is defined such the material is unable to relax (or produce deleterious defects from relaxation), such that the epitaxial layer remains pseudomorphic. This keeps the overall structure lattice matched to the substrate 401, while extending the wavelength of the absorbed laser light.

For example, the structures shown in FIGS. 1, 2 and 3, wherein the subcells 102, 104, 202, 204, 302, 304, 306, are latticed matched to the substrates 101, 201, 301, respectively, could be used with a laser source usually up to an 880 nm wavelength. To use a 930 nm laser source, the structure would have to grow a lattice mismatched LPC on the substrate. This reduces the quality of the LPC and increases the cost of making the device or decreases the yield. The LPC 400, on the other hand, provides a lattice matched structure with same processing, i.e., the same fabrication, as GaAs, but extends the wavelength range of the incident laser light that can be absorbed.

In addition, a metamorphic structure could be used for the LPC 400, wherein the subcells 402, 404, 406 have a lattice constant different than the substrate 401 and the subcells 402, 404, 406 are metamorphically grown on the substrate 401, which could extend the laser light absorption to more common wavelengths, such as 1300 nm or 1500 nm, without growing on expensive InP substrates.

InP lattice matched materials, such as GaInAs and AlGaInAs, are lower in bandgap than those grown on GaAs, and thus extend to lower energy (longer wavelength) absorption. By growing metamorphically, e.g., allowing the lattice to relax, the GaAs based wafer is cheaper to produce, etc., than the InP based wafer. However, the thickness of the metamorphic layers is limited. The lower the bandgap, the more difficult to fabricate (epitaxially grow) the layer. And, the quality suffers, which reduces the efficiency of the LPC device. So, by going to a metamorphic layer and using LBARs, one may keep both the quality of the material and the lower bandgap (extended wavelength).

In addition to the above structures, a reflective structure, such as a distributed Bragg reflector (DBR), can be placed between the bottom subcell 402 and the substrate 401 to increase absorption, or a reflector can be placed on the bottom-side of the GaAs substrate 401 to increase absorption, or the subcells 402, 404, 406 may be thinned to increase absorption, or the subcells 402, 404, 406 may be cooled to increase absorption.

Figure 5:
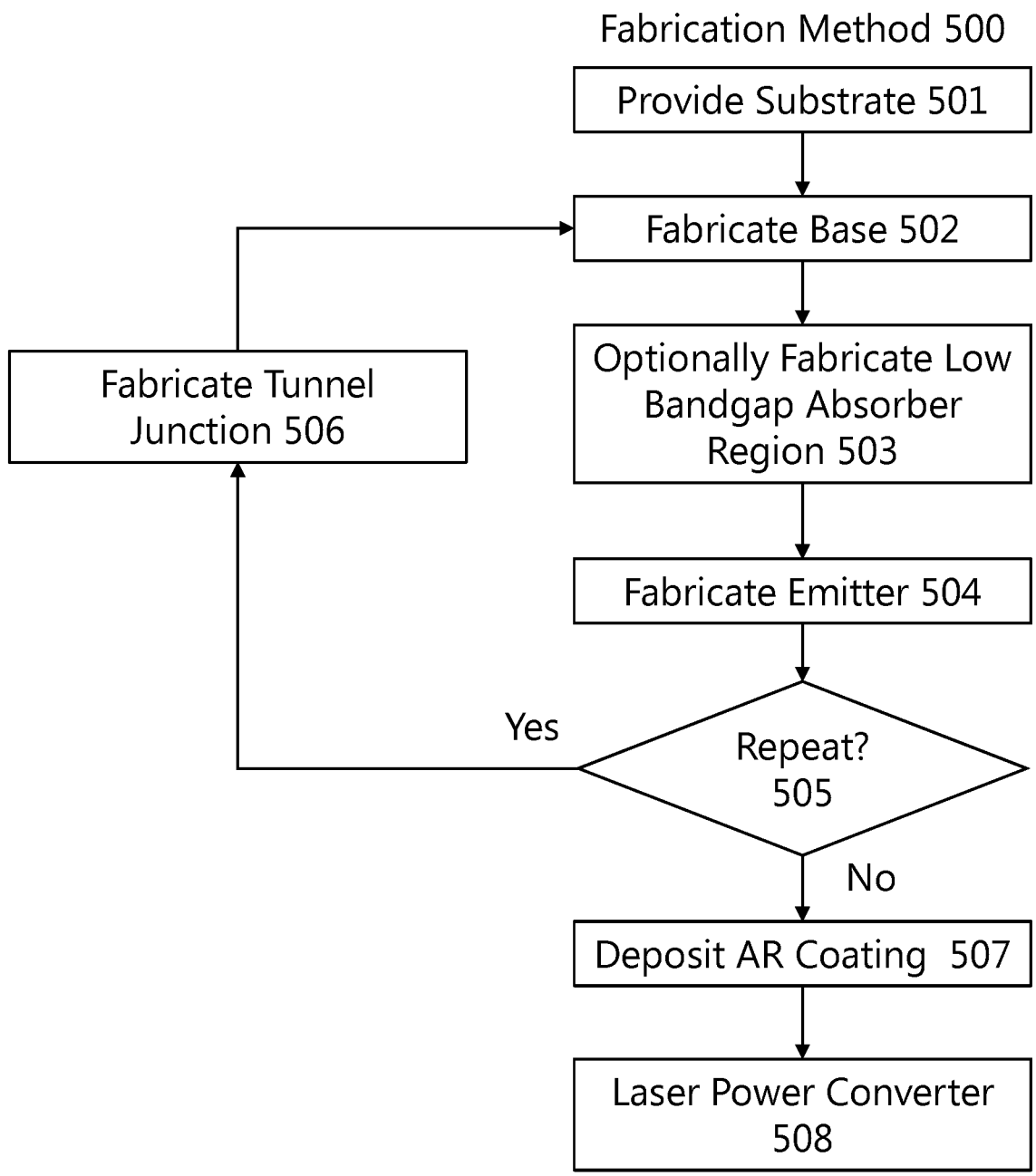
FIG. 5 is an example fabrication method for an LPC.

Thus, in this example, the LPC 400 has two or more (i.e., three) subcells 402, 404, 406, each with a different bandgap, wherein the LBAR 409, the LBAR (nid) 412 and the LBAR (nid) 415 are configured to produce a current balanced to the subcells 402, 404, 406 connected in series. In addition, the incident laser light not absorbed by the LBAR (nid) 415 and the LBAR (nid) 412 passes through to another one of the subcells 404 and/or 402. Moreover, the material of the LBAR (nid) 415 comprises GaInAs and the material of the base 416 and emitter 416 in the top subcell 306 comprises AlGaAs; the material of the LBAR (nid) 412 comprises GaInAs and the material of the base 413 and emitter 411 in the middle subcell 404 comprises AlGaAs; and the material of the LBAR 409 comprises GaInAs and the material of the base 410 and emitter 408 in the bottom subcell 402 comprises GaAs, Fabrication Method FIG. 5 is an example fabrication method 500 for the n-on-p III/V LPCs 200, 300 and 400 described herein.

Block 501 represents the step of providing a substrate.

Blocks 502, 503 and 504 represent the steps of fabricating a subcell, which include fabricating a base (502), optionally fabricating an LBAR (503), and fabricating an emitter (504), as well as other layers not described. The LBAR can be present in just the top and/or middle subcell of the LPC, or the LBAR can be present in all of the subcells of the LPC.

Block 505 is a decision block that determines whether another subcell should be fabricated. If so, Block 506 is performed, followed by a repetition of Blocks 502, 503 and 504; otherwise, Block 507 is performed.

Block 506 represents the step of fabricating a tunnel junction on the subcell.

Block 507 represents the step of depositing an AR coating on the subcell, as well as any other required processing.

Block 508 represents the end result of the fabrication method, namely, an LPC including one or more subcells with LBARs present in the subcells.

Conclusion

The description of the examples set forth above has been presented for purposes of illustration and description, and is not intended to be exhaustive or limited to the examples described. Many alternatives, modifications and variations may be used in place of the specific elements described above.

What is claimed is:

1. A device, comprising:
   a laser power converter (LPC) comprised of a plurality of subcells on a substrate, the plurality of subcells including top and bottom subcells;
   at least one of the plurality of subcells having an emitter and base with a low bandgap absorber region (LBAR) coupled between the emitter and base;
   the emitter and base are comprised of a first material with a first bandgap higher than a wavelength of incident laser light, such that the emitter and base are transparent to the incident laser light and do not generate a current in response to the incident laser light, wherein the first material is AlGaAs with an Al content higher than a mole fraction of 10%, the first bandgap is higher than 1.55 eV, and the wavelength of the incident laser light is 808 nm;
   the low bandgap absorber region is comprised of a second material with a second bandgap lower than the first bandgap, such that only the low bandgap absorber region absorbs the incident laser light and generates the current in response to the incident laser light, wherein the second material is Ga(In)As; and
   the current generated between the top and bottom subcells is controlled with the second material and thickness of the low bandgap absorber region only, such that only the low bandgap absorber region is configured to balance the current generated between the top and bottom subcells, and the emitter and base are not thickness limited to balance the current generated between the top and bottom subcells.

2. The device of claim 1, wherein the low bandgap absorber region is configured to produce a current balanced to the plurality of subcells connected in series.

3. The device of claim 1, wherein each of the plurality of subcells has a different bandgap.

4. The device of claim 1, wherein the plurality of subcells are lattice matched to the substrate.

5. The device of claim 1, wherein the plurality of subcells have a lattice constant different than the substrate and the plurality of subcells are metamorphically grown on the substrate.

6. The device of claim 1, wherein the low bandgap absorber region is present in the top or a middle subcell of the laser power converter.

7. The device of claim 1, wherein the low bandgap absorber region is present in all of the plurality of subcells of the laser power converter.

8. The device of claim 1, wherein the incident laser light not absorbed by the low bandgap absorber region passes through to another one of the plurality of subcells.

9. The device of claim 1, wherein the second material of the low bandgap absorber region comprises GaAs and the first material of the base and emitter comprises AlGaAs.

10. The device of claim 1, wherein the second material of the low bandgap absorber region comprises GaInAs and the first material of the base and emitter comprises AlGaAs.

11. The device of claim 1, wherein the low bandgap absorber region is comprised of one or more well layers contained within a region of barrier layers.

12. A method, comprising:
    fabricating a laser power converter (LPC) comprised of a plurality of subcells on a substrate, the plurality of subcells including top and bottom subcells;
    at least one of the plurality of subcells having an emitter and base with a low bandgap absorber region (LBAR) coupled between the emitter and base;
    the emitter and base are comprised of a first material with a first bandgap higher than a wavelength of incident laser light, such that the emitter and base are transparent to the incident laser light and do not generate a current in response to the incident laser light, wherein the first material is AlGaAs with an Al content higher than a mole fraction of about 10%, the first bandgap is higher than 1.55 eV, and the wavelength of the incident laser light is 808 nm;
    the low bandgap absorber region is comprised of a second material with a second bandgap lower than the first bandgap, such that the low bandgap absorber region absorbs the incident laser light and generates the current in response to the incident laser light, wherein the second material is Ga(In)As; and
    the current generated between the top and bottom subcells is controlled with the second material and thickness of the low bandgap absorber region only, such that only the low bandgap absorber region is configured to balance the current generated between the top and bottom subcells, and the emitter and base are not thickness limited to balance the current generated between the top and bottom subcells.

13. The method of claim 12, wherein the low bandgap absorber region is configured to produce a current balanced to the plurality of subcells connected in series.

14. The method of claim 12, wherein each of the plurality of subcells has a different bandgap.

15. The method of claim 12, wherein the plurality of subcells are lattice matched to the substrate.

16. The method of claim 12, wherein the plurality of subcells have a lattice constant different than the substrate and the plurality of subcells are metamorphically grown on the substrate.

17. The method of claim 12, wherein the low bandgap absorber region is present in the top or a middle subcell of the laser power converter.

18. The method of claim 12, wherein the low bandgap absorber region is present in all of the plurality of subcells of the laser power converter.

19. The method of claim 12, wherein the incident laser light not absorbed by the low bandgap absorber region passes through to another one of the plurality of subcells.

20. The method of claim 12, wherein the second material of the low bandgap absorber region comprises GaAs and the first material of the base and emitter comprises AlGaAs.

21. The method of claim 12, wherein the second material of the low bandgap absorber region comprises GaInAs and the first material of the base and emitter comprises AlGaAs.

22. The method of claim 12, wherein the low bandgap absorber region is comprised of one or more well layers contained within a region of barrier layers.

23. A method, comprising:
- converting incident laser light into current in a laser power converter (LPC) comprised of a plurality of subcells on a substrate, the plurality of subcells including top and bottom subcells;
- at least one of the plurality of subcells having an emitter and base with a low bandgap absorber region (LBAR) coupled between the emitter and base;
- the emitter and base are comprised of a first material with a first bandgap higher than a wavelength of incident laser light, such that the emitter and base are transparent to the incident laser light and do not generate a current in response to the incident laser light, wherein the first material is AlGaAs with an Al content higher than a mole fraction of about 10%, the first bandgap is higher than 1.55 eV, and the wavelength of the incident laser light is 808 nm;
- the low bandgap absorber region is comprised of a second material with a second bandgap lower than the first bandgap, such that only the low bandgap absorber region absorbs the incident laser light and generates the current in response to the incident laser light, wherein the second material is Ga(In)As; and
- the current generated between the top and bottom subcells is controlled with the second material and thickness of the low bandgap absorber region only, such that only the low bandgap absorber region is configured to balance the current generated between the top and bottom subcells, and the emitter and base are not thickness limited to balance the current generated between the top and bottom subcells.

* * * * *